(12) United States Patent
Rosen

(10) Patent No.: US 7,282,962 B1
(45) Date of Patent: Oct. 16, 2007

(54) INVERTED-PHASE DETECTOR

(75) Inventor: Eitan Rosen, Abirim (IL)

(73) Assignee: Marvell Semiconductor Israel, Ltd., Misgav (IL)

( * ) Notice: Subject to any disclaimer, the term of this patent is extended or adjusted under 35 U.S.C. 154(b) by 769 days.

(21) Appl. No.: 10/682,448

(22) Filed: Oct. 9, 2003

Related U.S. Application Data

(60) Provisional application No. 60/448,407, filed on Feb. 19, 2003.

(51) Int. Cl.
 *G01R 25/00* (2006.01)
(52) U.S. Cl. .................. 327/3; 327/7; 327/12
(58) Field of Classification Search .............. 327/1, 327/3, 7, 12
 See application file for complete search history.

(56) References Cited

U.S. PATENT DOCUMENTS

| | | | |
|---|---|---|---|
| 4,873,491 A | * | 10/1989 | Wilkins ............... 327/280 |
| 5,923,613 A | | 7/1999 | Tien et al. |
| 6,043,694 A | | 3/2000 | Dortu |
| 6,100,733 A | | 8/2000 | Dortu et al. |
| 6,509,762 B1 | | 1/2003 | Moss et al. |
| 2002/0140478 A1 | | 10/2002 | Fletcher et al. |

\* cited by examiner

*Primary Examiner*—Kenneth B. Wells

(57) ABSTRACT

An inverted-phase detector is implemented in a system including a first clock circuit that provides a first clock signal and a delayed clock circuit that outputs an delayed clock signal. A reference circuit outputs a reference signal. A feedback circuit generates a feedback signal that is one of greater than and less than the reference signal when the first clock signal changes state before the second clock signal, and that is the other of greater than and less than the reference signal when the first clock signal changes state after the second clock signal.

36 Claims, 3 Drawing Sheets

INVERTED-PHASE DETECTOR

CROSS-REFERENCE TO RELATED APPLICATIONS

This application claims the benefit of U.S. Provisional Application No. 60/448,407, filed on Feb. 19, 2003, which is hereby incorporated by reference in its entirety.

FIELD OF THE INVENTION

The present invention relates to inverted-phase detectors, and more particularly to an inverted-phase detector that provides feedback with high accuracy.

BACKGROUND OF THE INVENTION

In many digital communications applications, it is necessary to sample an input signal to recover data. For example, in high frequency DDR (double data rate) link interfaces, it is necessary to sample the input signal at an optimum time. In some applications, the ideal sample point occurs at a midpoint of a high or low state. Therefore, dividing a cycle accurately is necessary to identify the optimal sampling point.

One conventional sampling circuit determines the sampling points using a fixed time delay. In other words, a sample is taken at a time corresponding to 90 degrees, which is the equivalent of a quarter cycle, after a falling edge or a rising edge of the clock signal. However, this approach does not take into account the fact that clock signals are not ideal.

In some applications, system imperfections may cause the clock signal to be asymmetrical. For example, the high state may be shorter than the low state. If the high state is only 150 degrees instead of 180 degrees, the determination of the midpoint of the high state may be incorrect if the fixed time delay is used. In this case, the midpoint of the high state is 75 degrees rather than 90 degrees after the rising or falling edge of the clock signal. If the sample is taken at 90 degrees from this rising or falling edge, the sample is not taken at the midpoint. In this example, the sample is taken 90 degrees from the rising or falling edge and 60 degrees from the next falling or rising edge, respectively.

One possible inverted-phase detector incorporates a flip-flop circuit that identifies the relative timing of the clock signal and a delayed clock signal. The flip-flop circuit is triggered by the delayed clock signal. For example, if the output of the flip-flop circuit is a "1," the delayed clock signal is changing state too early with respect to the clock signal. Conversely, if the output of the flip-flop is a "0," the delayed clock signal is changing state too late with respect to the clock signal.

Flip-flops that are used in this manner have an accuracy within 50-100 picoseconds. The relatively low accuracy of this phase detection circuit typically increases the requirements on other system circuits, which increases the overall cost of system and may reduce yields.

SUMMARY OF THE INVENTION

An inverted-phase detector receives a clock signal and a delayed clock signal. A reference circuit outputs a reference signal. A feedback circuit generates a feedback signal. The feedback signal is one of greater than and less than the reference signal when the clock signal changes state before the delayed clock signal. The feedback signal is the other of greater than and less than the reference signal when the clock signal changes state after the delayed clock signal.

In other features, a sense amplifier communicates with the reference circuit and the feedback circuit and generates one of an early signal and a late signal. A latch communicates with the sense amplifier and latches the output of the sense amplifier.

In still other features, the reference signal has a substantially constant voltage. The inverted-phase detector has an accuracy that is less than 25 picoseconds and in some implementations less than 5 picoseconds.

A phase adjustment system includes clock circuit that outputs a clock signal and a delayed clock signal. A reference circuit outputs a reference signal. A feedback circuit generates a feedback signal based on the clock signal and the delayed clock signal. The feedback signal is one of greater and less than the reference signal when the clock signal changes state before the delayed clock signal. The feedback signal is the other of greater than and less than the reference signal when the clock signal changes state after the delayed clock signal. A phase correction control circuit receives at least one of the feedback signal and the reference signal and adjusts a phase of at least one of the clock signal and the delayed clock signal.

In other features, a sense amplifier communicates with the reference circuit and the feedback circuit and generates one of an early signal and a late signal. A latch communicates with the sense amplifier and latches the output of the sense amplifier.

In still other features, the reference signal has a substantially constant voltage. The inverted-phase detector has an accuracy that is less than 25 picoseconds and in some implementations less than 5 picoseconds.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
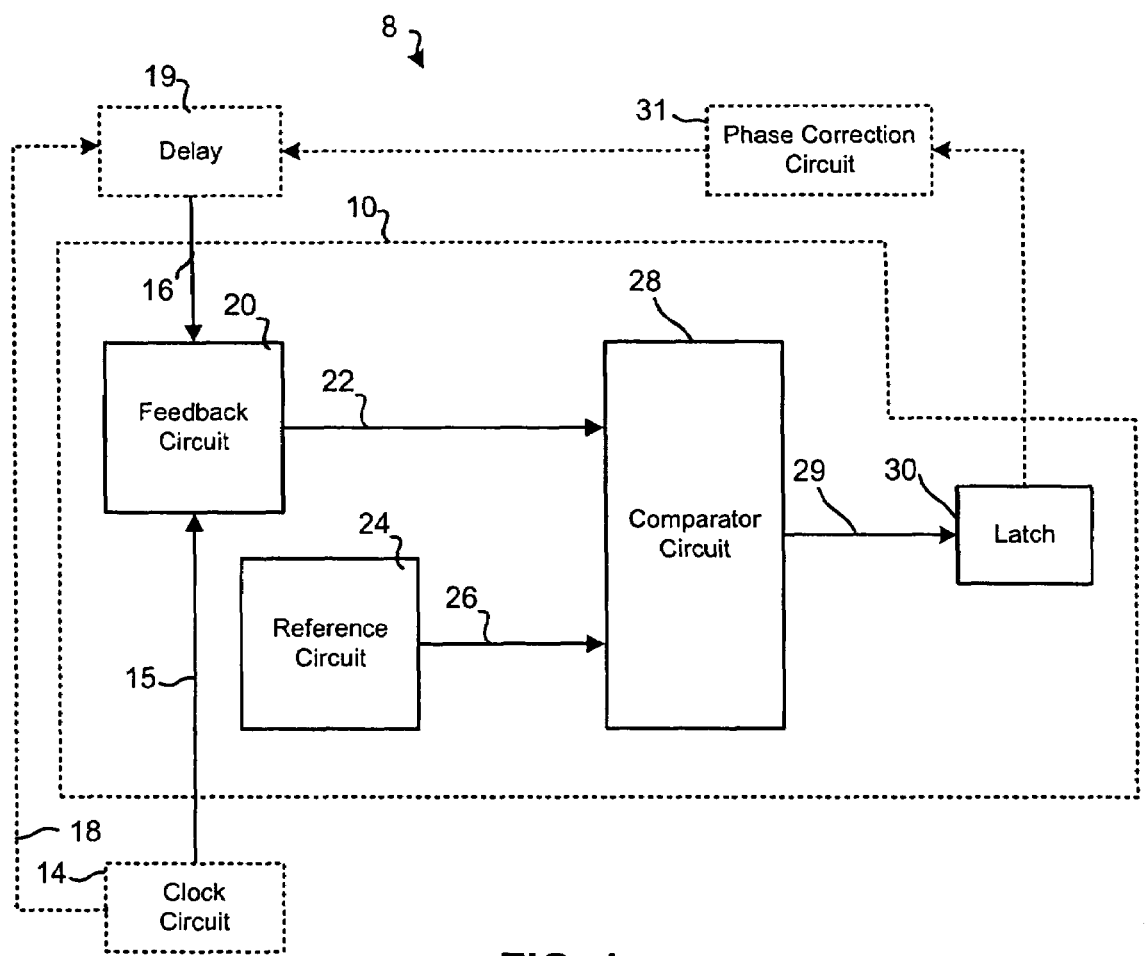
FIG. 1 is a functional block diagram of a system including an inverted-phase detector circuit according to the present invention.

The following description of the preferred embodiment(s) is merely exemplary in nature and is in no way intended to limit the invention, its application, or uses. For purposes of clarity, the same reference numbers will be used in the drawings to identify similar elements.

Referring now to FIG. 1, a system 8 includes an inverted-phase detector 10. The system 8 includes a clock circuit 14 that generates a clock signal 15 and a delayed clock signal 16. The delayed clock signal 16 may be generated using a delay element 19 that delays the clock signal 15 or in any other suitable manner. The clock signal 15 and the delayed clock signal 16 are input to the inverted-phase detector 10.

The inverted-phase detector 10 includes a feedback circuit 20, a reference circuit 24, a comparator circuit 28 and a latch 30. The feedback circuit 20 outputs a feedback signal. The feedback circuit 20 generates the feedback signal 22 that is based on the clock signal 15 and the delayed clock signal 16. More particularly, the feedback signal 22 is determined based on the phase difference between the clock signal 15 (less 180 degrees) and the delayed clock signal 16. For example, if the delayed clock signal 16 changes state before the clock signal 15, the feedback signal 22 has a first level. Conversely, if the delayed clock signal 16 changes state after the clock signal 15, the feedback signal 22 has a second level.

A reference circuit 24 outputs a reference signal 26, which is preferably but not necessarily a substantially constant voltage. For example, the reference circuit 24 may generate the reference signal 26 based on a constant bias voltage. The feedback signal 22 and the reference signal 26 are used to detect the relative phases of the clock signal and the delayed clock signal.

The feedback signal and the reference signal are inputs to a comparator circuit 28. The comparator circuit 28 determines when the feedback signal 22 is greater than or less than the reference signal 26. For example, the feedback signal 22 may be greater than the reference signal 26 when the feedback signal 22 is positive (or negative). Conversely, the feedback signal 22 may be less than the reference signal 26 when the feedback signal is negative (or positive). In other words, the comparator circuit 28 determines whether the delayed clock signal 16 changes state before or after the clock signal 15. The latch 30 stores the result of the comparison. The system 8 may also include a phase correction circuit 31, which uses the output of the comparator circuit 28 and/or the latch 30 (as shown) to adjust the clock circuit 14 and/or the delay element 19 (as shown).

The clock circuit 14, the phase correction circuit 31 and the delay element 19 are not part of the inverted-phase detector 10. In a preferred embodiment, the system 8 delays the clock signal without inverting it. Half a cycle after a transient (for example a rising transient), one observes another opposite transient (for example a falling transient) on the clock input. A delayed clock signal that is delayed by exactly half a cycle will output a transient of the first polarity (for example a rising transient) at that very time. The inverted-phase detector needs to measure that—hence it is an inverted-phase detector and not an inverted phase detector.

Figure 2:
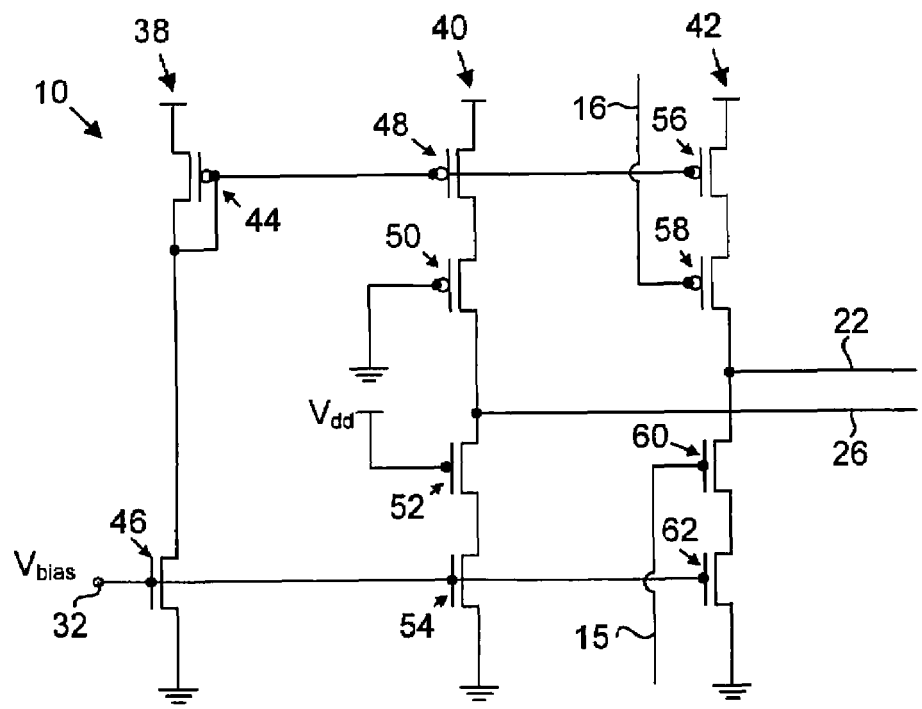
FIG. 2 illustrates an exemplary implementation of an inverted-phase detector circuit according to the present invention.

Referring now to FIG. 2, an exemplary implementation of the inverted-phase detector 10 is shown. The inverted-phase detector circuit 10 generates the feedback signal 22 and the reference signal 26. A bias voltage is applied to a bias node 32. The bias voltage causes P and N-type transistor devices in the inverted-phase detector 10 to draw a current. The P and N-type devices are arranged in a left stack 38, a center stack 40, and a right stack 42. The left stack 38 includes a P-type device 44 and an N-type device 46. The center stack 40 includes P-type devices 48 and 50 and N-type devices 52 and 54. The right stack 42 includes P-type devices 56 and 58 and N-type devices 60 and 62.

The bias voltage is applied to the gates of the N-type devices 46, 54, and 62. Because the same voltage is applied to the gates of these devices, the N-type devices 46, 54 and 62 draw the same current. The left stack 38 is connected in a current mirror configuration with the center stack 40 and the right stack 42. The P-type device 44 biases its own gate. This causes the P-type device 44 to drive a current that is equal to a current being demanded of it. Therefore, the P-type device 48 and the P-type device 56 draw the same current as the P-type device 44. The N-type devices 46, 54 and 62 and the P-type devices 44, 48 and 56 draw the same current.

The center stack 40 generates the reference signal 26. A gate of the P-type device 50 is connected to ground. A gate of the N-type device 52 is connected to $V_{dd}$. Both the P-type device 50 and the N-type device 52 conduct current to generate the reference signal 26.

The right stack 42 generates the feedback signal 22. The clock signal 15 is connected to a gate of the N-type device 60. The delayed clock signal 16 is connected to a gate of the P-type device 58. The delayed clock signal 16 is out of phase with the clock signal 15. In the preferred embodiment, the delayed clock signal 16 is approximately 180° out of phase with the clock signal 15. Therefore, when the clock signal 15 is in a high state, the delayed clock signal 16 is in a low state. Conversely, when the clock signal 15 is in a low state, the delayed clock signal 16 is in a high state. Compensation for process and slope variations may be performed by adjusting the sizes of the P-type device 58 and/or the N-type device 60.

Prior to a change of state of the clock signal 15 or the delayed clock signal 16, the right stack 42 is identical to the center stack 40 because the devices of the right stack 42 receive the same inputs as the devices of the center stack 40. In other words, the feedback signal 22 and the reference signal 26 are equal when the clock signal 15 is high and the delayed clock signal 16 is low. For example, if the clock signal 15 is high, then the delayed clock signal 16 is low. In this state, both the N-type device 60 and the P-type device 58 are on. If the clock signal 15 changes to a low state before the delayed clock signal 16 changes to a high state, the N-type device 60 will begin to turn off. As a result, the feedback signal 22 will begin to increase. When the delayed clock signal 16 changes to a high state, the P-type device 58 turns off. This will cause the feedback signal 22 to float and retain the value of the reference signal 26. Therefore, when the clock signal 15 changes to a low state before the delayed clock signal 16 changes to a high state, the feedback signal 22 will only be able to increase slightly above the value of the reference signal 26. The difference between the feedback and reference signals may depend on factors such as current, capacitance, and elapsed time between the state changes of the clock signal 15 and the delayed clock signal 16.

Conversely, if the delayed clock signal 16 changes to a high state before the clock signal 15 changes to a low state, the P-type device 58 will turn off. The feedback signal 22 will begin to decrease. When the clock signal 15 changes to a low state, the N-type device 60 turns off. The feedback signal 22 is fixed until one of the clocks changes stage again. It will return to it's initial value (equal to the reference signal) when both clocks have transitioned.

Phase error occurs when the clock signal 15 and the delayed clock signal 16 do not transition at the same time. The voltage difference between the feedback signal 22 and the reference signal 26 indicates a direction of the phase error. If the clock signal 15 changes state before the delayed clock signal, the difference between the feedback signal 22 and the reference signal 26 is positive. In other words, the difference is positive if the clock signal 15 is early or the delayed clock signal 16 is late. If the clock signal 15 changes state after the delayed clock signal 16, the difference between the feedback signal 22 and the reference signal 26 is negative. In other words, the difference is negative if the clock signal 15 is late or the delayed clock signal 16 is early.

Figure 3:
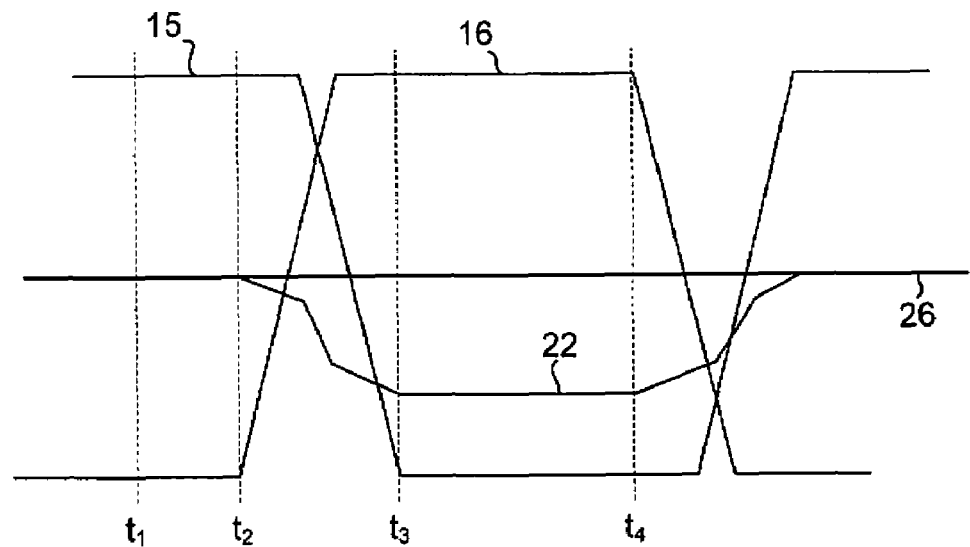
FIG. 3 illustrates an exemplary feedback signal of the inverted-phase detector circuit according to the present invention.

Referring now to FIG. 3, the clock signal 15 is high and the delayed clock signal 16 is low at $t_1$. The feedback signal 22 and the reference signal 26 are equivalent at time $t_1$. At time $t_2$, the delayed clock signal 16 begins to change from a low state to a high state. Because the delayed clock signal 16 is early, the feedback signal 22 begins to decrease, creating a negative difference between the feedback signal 22 and the reference signal 26. The feedback signal 22 decreases until the clock signal 15 attains a low state at $t_3$. At $t_3$, the feedback signal 22 remains constant until the delayed clock signal 16 begins to change from a high state to a low state at $T_4$. The feedback signal 22 begins to increase until $t_5$, when the clock signal 15 is high and the delayed clock signal 16 is low. At $t_5$, the feedback signal 22 is equivalent to the reference signal 26.

Figure 4:
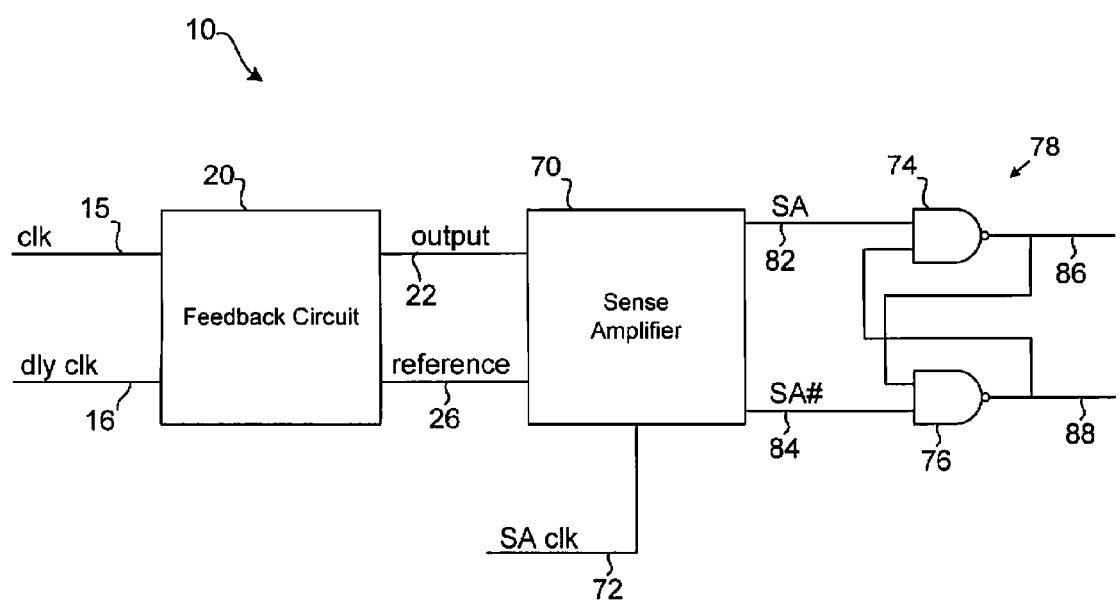
FIG. 4 is a functional block diagram of an inverted-phase detector circuit with a sense amplifier and a latch according to the present invention.

The difference between the feedback signal 22 and the reference signal 26 is sensed by a sense amplifier 70 as shown in FIG. 4. The feedback signal 22 and the reference signal 26 are input to the sense amplifier 70 from the inverted-phase detector 10. The sense amplifier 70 strobes the feedback signal 22 to amplify the difference between the feedback signal 22 and the reference signal 26. It is to be understood that any suitable sense amplifier may be used with the present invention. The sense amplifier 70 samples the signals from the inverted-phase detector 10 according to a sense amplifier clock 72. In the present implementation, the feedback circuit 20 may include the reference circuit 24 of FIG. 1.

The NAND gates 74 and 76 are cross-coupled to form a latch 78. The latch 78 latches on first and second sense amplifier outputs 80, 82 from the sense amplifier 70. The sense amplifier outputs 80 and 82 are either a "1" or a "0." A second sense amplifier output 82 is the opposite of a first sense amplifier output 80. For example, if the first sense amplifier output 80 is a "1," the second sense amplifier output 82 is a "0." Both of the sense amplifier outputs 80 and 82 are a "1" if the sense amplifier 70 is inactive. The sense amplifier outputs 80 and 82 cause the NAND gates 74 and 76 to latch according to the order that the clock signal 15 and the delayed clock signal 16 change states. Latch outputs 84 and 86 will be either a "10" or a "01," depending on the sense amplifier outputs 80 and 82. If the latch outputs 84 and 86 are "10," then the clock signal 15 changed state early. If the latch outputs 84 and 86 are "01," then the clock signal 15 changed state late. Although the preferred embodiment uses a latch including NAND gates, any suitable latch may be used with the present invention.

The latch outputs 84 and 86 may be fed to the phase correction circuit 31 in FIG. 1. The phase correction circuit 31 adjusts the clock signal 15 and/or the delayed clock signal 16 according to the latch outputs 84 and 86. In other words, the phase correction circuit 31 shifts the phase of the clock signal 15 and/or the delayed clock signal 16 in order to correct a phase error between the clock signal 15 and the delayed clock signal 16.

The inverted-phase detector 10 has an accuracy that is less than 25 picoseconds. In a highly preferred embodiment shown in FIG. 2, the inverted-phase detector 10 has an accuracy that is less than 5 picoseconds. The increased accuracy reduces the requirements on circuits in a system, which increases yields and reduces overall cost.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A phase detector that receives a clock signal and a delayed clock signal, comprising:
    a reference circuit that outputs a reference signal; and
    a feedback circuit that generates a feedback signal,
        wherein said feedback signal is one of greater than and less than said reference signal when the clock signal changes state before the delayed clock signal, and
        wherein said feedback signal is the other of greater than and less than said reference signal when the clock signal changes state after the delayed clock signal.

2. The phase detector of claim 1 further comprising a sense amplifier that communicates with said reference circuit and said feedback circuit and that generates one of an early signal and a late signal.

3. The phase detector of claim 2 further comprising a latch that communicates with said sense amplifier and that latches an output of said sense amplifier.

4. The phase detector of claim 1 wherein said reference signal has a substantially constant voltage.

5. The phase detector of claim 1 wherein said phase detector has an accuracy that is less than 25 picoseconds.

6. The phase detector of claim 1 wherein said phase detector has an accuracy that is less than 5 picoseconds.

7. A phase adjustment system, comprising:
    a clock circuit that outputs a clock signal and a delayed clock signal;
    a reference circuit that outputs a reference signal;
    an feedback circuit that generates a feedback signal based on said clock signal and said delayed clock signal,
        wherein said feedback signal is one of greater and less than said reference signal when said clock signal changes state before said delayed clock signal, and
        wherein said feedback signal is the other of greater than and less than said reference signal when said clock signal changes state after said delayed clock signal;
    a phase correction control circuit that adjusts a phase of at least one of said clock signal and said delayed clock signal based on said feedback signal and said reference signal.

8. The phase adjustment system of claim 7 wherein said phase correction control circuit includes a sense amplifier that communicates with said reference circuit and said feedback circuit and that generates one of an early signal and a late signal.

9. The phase adjustment system of claim 8 wherein said phase correction control circuit includes a latch that communicates with said sense amplifier and that latches an output of said sense amplifier.

10. The phase adjustment system of claim 7 wherein said reference signal has a substantially constant voltage.

11. The phase adjustment system of claim 7 wherein said inverted-phase detector has an accuracy that is less than 25 picoseconds.

12. The phase adjustment system of claim 7 wherein said inverted-phase detector has an accuracy that is less than 5 picoseconds.

13. A phase detector that receives a clock signal and a delayed clock signal, comprising:
   reference means for providing a reference signal; and
   feedback means for generating a feedback signal based on the clock signal and the delayed clock signal,
   wherein said feedback signal is one of greater than and less than said reference signal when the clock signal changes state before the delayed clock signal, and
   wherein said feedback signal is the other of greater than and less than said reference signal when the clock signal changes state after the delayed clock signal.

14. The phase detector of claim 13 further comprising sense means that communicates with said reference means and said feedback means for generating one of an early signal and a late signal.

15. The phase detector of claim 14 further comprising latch means that communicates with said sense means for latching an output of said sense means.

16. The phase detector of claim 13 wherein said reference signal has a substantially constant voltage.

17. The phase detector of claim 13 wherein said phase detector has an accuracy that is less than 25 picoseconds.

18. The phase detector of claim 13 wherein said phase detector has an accuracy that is less than 5 picoseconds.

19. A phase adjustment system, comprising:
   clock means that outputs a clock signal and a delayed clock signal;
   reference means for providing a reference signal;
   feedback means that receives said clock signal and said delayed clock signal for generating a feedback signal,
   wherein said feedback signal is one of greater and less than said reference signal when said clock signal changes state before said delayed clock signal, and
   wherein said feedback signal is the other of greater than and less than said reference signal when said clock signal changes state after said delayed clock signal; and
   phase correction control means for adjusting at least one of a phase of said clock signal and said delayed clock signal based on said feedback signal and said reference signal.

20. The phase adjustment system of claim 19 wherein said phase correction control means includes sense means that communicates with said reference means and said feedback means for generating one of an early signal and a late signal.

21. The phase adjustment system of claim 20 wherein said phase correction control means includes latch means that communicates with said sense means for latching an output of said sense means.

22. The phase adjustment system of claim 19 wherein said reference signal has a substantially constant voltage.

23. The phase adjustment system of claim 19 wherein said inverted-phase detector has an accuracy that is less than 25 picoseconds.

24. The phase adjustment system of claim 19 wherein said inverted-phase detector has an accuracy that is less than 5 picoseconds.

25. A method for operating a phase detector that receives a clock signal and a delayed clock signal, comprising:
   generating a reference signal; and
   generating a feedback signal,
   wherein said feedback signal is one of greater than and less than said reference signal when the clock signal changes state before the delayed clock signal, and
   wherein said feedback signal is the other of greater than and less than said reference signal when the clock signal changes state after the delayed clock signal.

26. The method of claim 25 further comprising generating one of an early signal and a late signal.

27. The method of claim 26 further comprising latching said one of said early signal and said late signal.

28. The method of claim 25 wherein said reference signal has a substantially constant voltage.

29. The method of claim 25 wherein said phase detector has an accuracy that is less than 25 picoseconds.

30. The method of claim 25 wherein said phase detector has an accuracy that is less than 5 picoseconds.

31. A method for operating a phase adjustment system, comprising:
   generating a clock signal and a delayed clock signal;
   providing a reference signal;
   generating a feedback signal based on said clock signal and said delayed clock signal,
   wherein said feedback signal is one of greater and less than said reference signal when said clock signal changes state before said delayed clock signal, and
   wherein said feedback signal is the other of greater than and less than said reference signal when said clock signal changes state after said delayed clock signal; and
   adjusting a phase of at least one of said clock signal and said delayed clock signal based on said feedback signal and said reference signal.

32. The method of claim 31 further comprising generating one of an early signal and a late signal.

33. The method of claim 32 further comprising latching said one of said early signal and said late signal.

34. The method of claim 31 wherein said reference signal has a substantially constant voltage.

35. The method of claim 31 wherein said phase detector has an accuracy that is less than 25 picoseconds.

36. The method of claim 31 wherein said phase detector has an accuracy that is less than 5 picoseconds.

* * * * *